July 12, 1960 J. S. KILBY ET AL 2,945,163

COMPONENT MOUNTING FOR PRINTED CIRCUITS

Filed Jan. 10, 1955 2 Sheets-Sheet 1

INVENTORS:
Jack S. Kilby
Le Roy E. Dilger
by John W. Michael
Attorney

July 12, 1960 J. S. KILBY ET AL 2,945,163

COMPONENT MOUNTING FOR PRINTED CIRCUITS

Filed Jan. 10, 1955 2 Sheets-Sheet 2

INVENTORS:
Jack S. Kilby
Le Roy E. Dilger
by John W. Michael
Attorney

United States Patent Office 2,945,163

Patented July 12, 1960

2,945,163

COMPONENT MOUNTING FOR PRINTED CIRCUITS

Jack S. Kilby and Le Roy E. Dilger, Milwaukee, Wis., assignors to Globe-Union Inc., Milwaukee, Wis., a corporation of Delaware Filed Jan. 10, 1955, Ser. No. 480,686

4 Claims. (Cl. 317—101)

This invention relates to mountings and seals for an electrical component within a printed circuit plate and to the method of making them.

Heretofore, it has been the practice to mount the electrical components for printed circuits on the surface of a printed circuit plate. Components such as resistors and capacitors have been formed by applying conductive coatings to the plate; larger capacitors and tubes have been constructed independently and then attached to the surface of the plate. This art is described in the publication "New Advances in Printed Circuits," National Bureau of Standards Miscellaneous Publication 192 issued November 22, 1948, on pages 10–14. This practice has been satisfactory in the past where the space has been adequate for the electrical circuits; however, with the increased complexity of electrical circuitry, it has become desirable to reduce the amount of space occupied by the electrical circuits. This trend toward miniaturization has become a necessity for many electronic products; the progress is illustrated by the development of new products, such as transistors. The present state of the printed circuit art is illustrated by U.S. Patent 2,637,777 of Jack S. Kilby and Alfred S. Khouri and U.S. Patent 2,877,389 of Robert Wiener, both of which have been assigned to Globe-Union Inc., the assignee of this application. These show surface mounting of the electrical components on printed circuit plates. This is satisfactory for small components which do not require an enclosed mounting, which do not put too much mechanical strain on the printed circuit plate and where the ultimate in miniaturization is not required. The transistor art, specifically, has developed along a pattern similar to that stated above. Presently, transistors are sealed within a metal container or encapsulated with a resin coating to preserve the transistor from the effects of heat and humidity, thus prolonging the life and improving the dependability of the transistor. The sealed transistor is then mounted on the surface of a printed circuit plate.

It is the main object of this invention, therefore, to provide a mounting for an electrical component in a minimum amount of space within a printed circuit plate.

It is another object of this invention to provide a seal for an electrical component mounted in a minimum amount of space within a printed circuit plate.

It is a more specific object of this invention to provide a mounting and seal for a transistor in a minimum amount of space within a printed circuit plate.

The foregoing objects and others ancillary thereto are accomplished as follows:

According to a preferred incorporation of this invention, a recess, with internal dimensions sufficient to contain the electrical component, is provided within a printed circuit plate which can be molded out of ceramic. The bottom surface of the recess has holes which are properly spaced to receive the terminals of the electrical component. The seal of the mounting is accomplished by metallizing the area on the top edge of the recess so that the metal cover may be secured and sealed with solder; the area around the terminal holes in the bottom is likewise metallized so that the terminal holes may be sealed and secured with solder to mount and completely enclose the unit.

The features of the method of mounting and sealing of an electrical component described herein which we consider new and useful and, therefore, patentable invention are set forth in the claims below. The details and scope of the invention itself can best be understood by reading the specification and analyzing the drawings, in which:

Figures 1, 2:
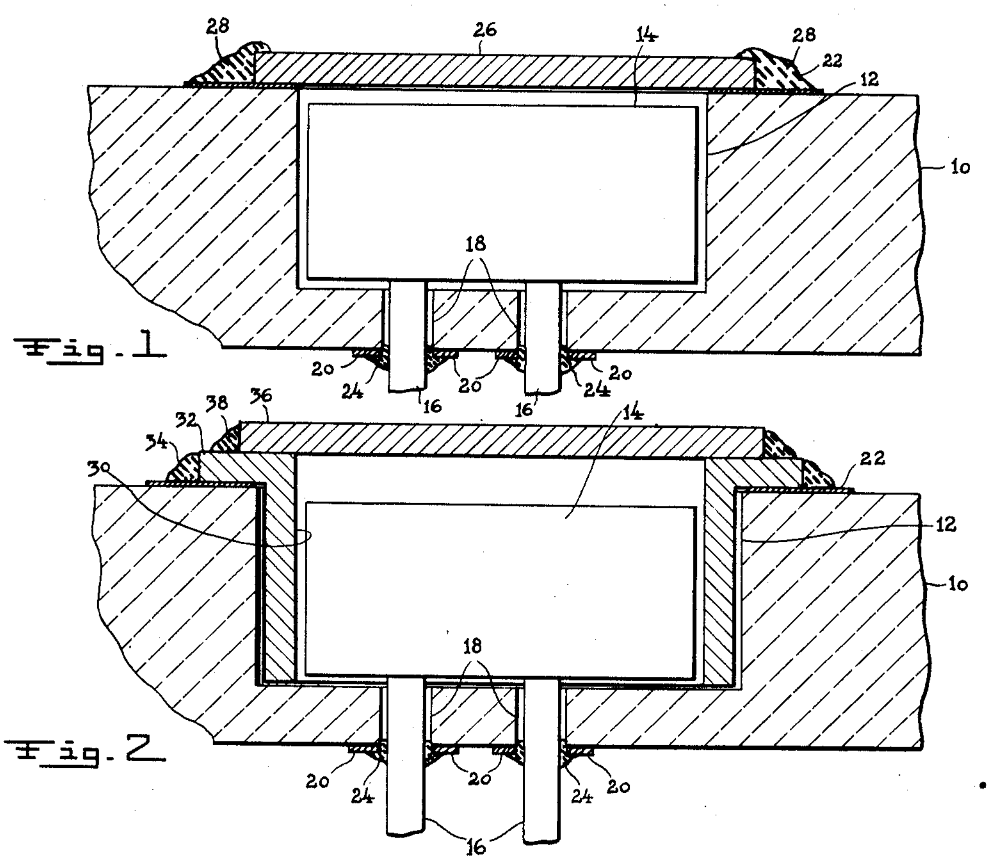
Fig. 1 is a view partly in elevation and partly in section of a mounting and seal for an electrical component within a printed circuit plate and embodying the present invention.
Fig. 2 is a view partly in elevation and partly in section of a mounting and seal for an electrical component within a printed circuit plate embodying a first modification of this invention.

The views in the drawings are greatly magnified, the electrical component for example is about 0.178″ in diameter and 0.069″ in height. The essential elements of this invention common to all of the modifications thereof consist of an insulating plate 10 of non-porous material, such as ceramic, having a recess 12 in which is positioned an electrical component 14. Terminals 16 attached to said component extend out through holes 18 in the bottom of such recess. The outer surface area of the plate 10 around the holes 18 and the top of recess are metallized as indicated at 20 and 22. These areas may be connected by conductors to other components. They function as a soldering base and solder indicated at 24 seals, secures and electrically connects the terminals 16 to the plate 10 thus physically holding the component 14 in place. As hereinafter explained, solder will attach to the area 22 to complete the seal at the top of such recess. The recess 12 is cylindrical in shape although many other shapes are possible and have proven satisfactory.

In Fig. 1 the top of recess 12 is closed by a metal cover 26 secured by solder 28 to the silvered area 22. This seal is useful with components such as capacitors which will withstand the heat transmitted to them when the soldering is done. The cover 26 may be made of a circular solder piece which is heated and pressed to form the sealed connection with the silvered area 22.

The first modification of Fig. 2 is designed to prevent damage to the component 14 from the heat used to seal the recess 12. A metal ring 30 is placed around the inside of the recess 12. The top of this ring has a flange 32 resting on the metallized area 22 and secured thereto by solder 34 before the electrical component 14 is placed in the recess 12. A metal cover 36 is then placed over the metal ring 30 and welded in place by using concentric welding electrodes which are in contact with the flange 32 and cover 36. Alternatively, it is possible to tin the cover 36 and flange 32 and apply heat by resistance to fuse the solder. In either case the heat is applied for such a short time that no damage would occur to a transistor employed as the component. In this modification, the cover 36 and the ring 30 can be made of nickel.

Figure 3:
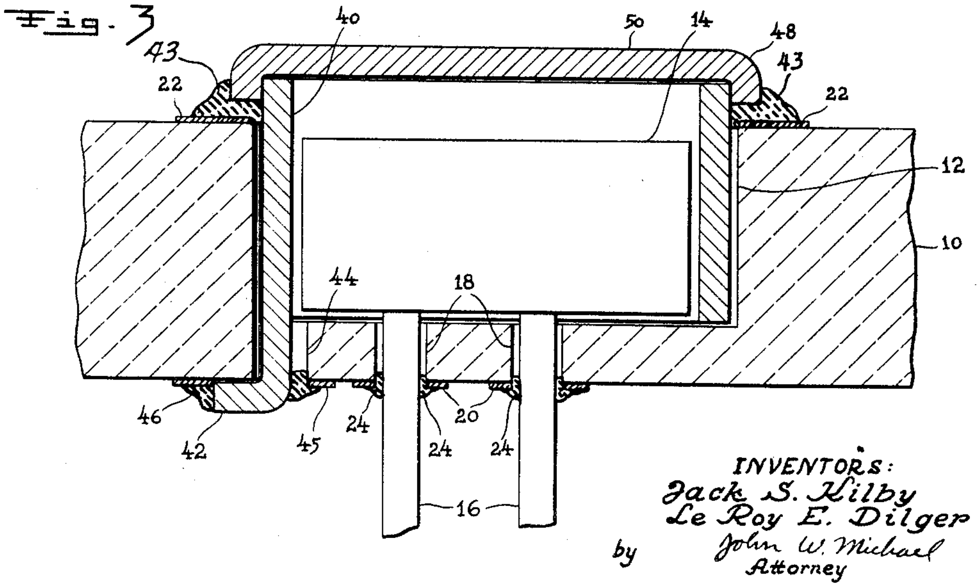
Fig. 3 is a view partly in elevation and partly in section of a mounting and seal for an electrical component within a printed circuit plate embodying a second modification of this invention.

The second modification shown in Fig. 3 employs a tubular interliner 40 within the recess 12 with a tab 42 extending through a hole 44 in the bottom of such recess. A silvered area 45 surrounds such hole. The top of the tubular interliner 40 and the tab 42 are soldered at 43 and 46. Then the electrical component 14 is inserted in the recess 12 within such interliner. The tubular interliner 40 extends above the plate 10 so that a depending flange 48 on the cover 50 extends over the sides of such interliner. The cover 50 is then welded or resistance soldered by placing electrodes in contact with such cover and tab 42. A hermetic seal is obtained by soldering the terminals 16 to silvered areas 20 by solder 24 which seals the holes 18. This last operation can be done in an atmosphere of nitrogen thereby providing an inert atmosphere for a transistor mounting assembly. Vacuum sealing of the component is also possible in this operation.

Figure 4:
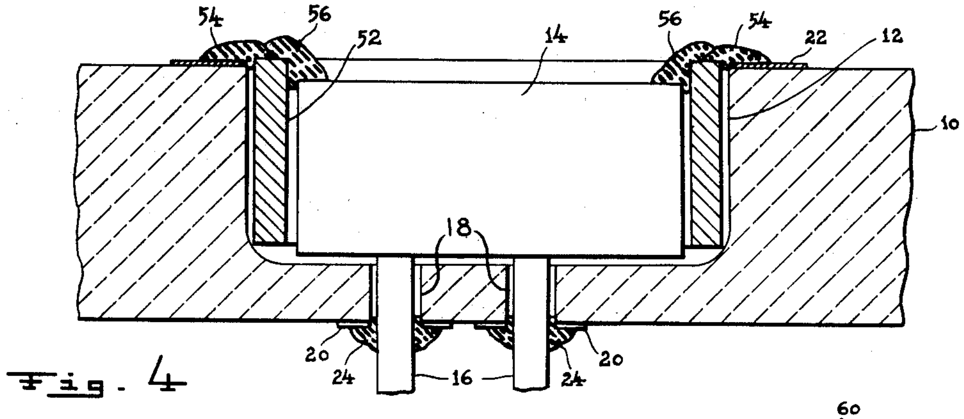
Fig. 4 is a view partly in elevation and partly in section of a mounting and seal for an electrical component within a printed circuit plate embodying a third modification of this invention.

The third modification shown in Fig. 4 has a metal ring 52 within the recess 12 soldered to the metallized area 22 by a high temperature solder 54. Then, the electrical component 14 is placed inside the ring 52 with the terminals 16 extending downwardly through the holes 18. The top of the assembly is sealed with a low temperature solder 56 placed between the metal ring 52 and the metal casing of component 14. The bottom is also sealed by low temperature solder 24 between terminals 16 and metallized areas 20 to close the holes 18. This modification can also be used for a heat sensitive component such as a transistor. It utilizes the outer surface of the component cover to eliminate a separate cover.

Figure 5:
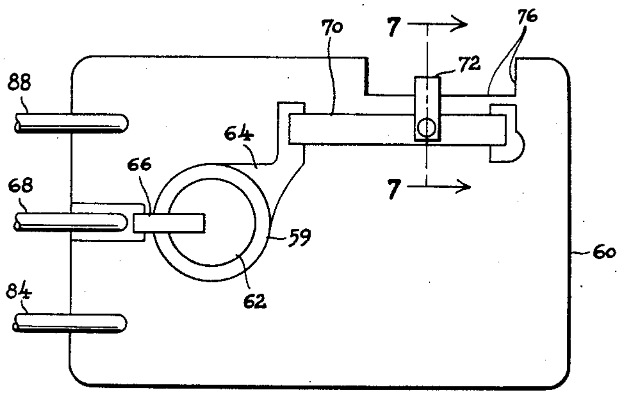
Fig. 5 is a top plan view of a printed circuit unit including an electrical component mounted and sealed within the ceramic plate in accordance with this invention.
Figure 7:
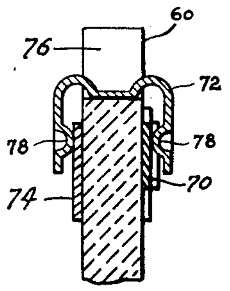
Fig. 7 is an enlarged sectional view taken on the line 7—7 of Fig. 5.
Figure 8:
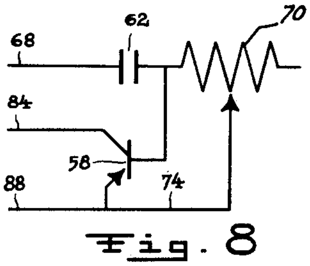
Fig. 8 is an electrical diagram for such unit.
Figure 6:
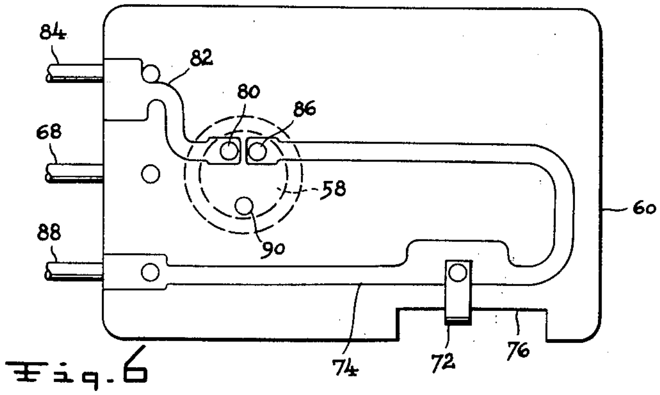
Fig. 6 is a bottom plan view of the unit viewed in Fig. 5.

Figs. 5 and 6 illustrate how any of the above mounts and seals may be used to fasten a transistor 58 in an insulating plate 60 according to this invention and connect it to other components. A disk capacitor 62 is mounted on the cover 59 of the mounting for such transistor. Such cover is connected to a silvered area 64 and, hence, the lower electrode of the capacitor 62 is also connected to such area. The other electrode of such capacitor is connected by a ribbon conductor 66 to an external lead 68. A resistance 70 is placed on the top of the plate 60 and connected to the area 64. A spring clip member 72 has one leg slidably engaging the resistor 70 and the other leg riding on a conductive strip 74 on the bottom of the plate 60. It is desirable to provide a notch 76 in the edge of such plate to protect the clip 72. It is also advantageous to provide dots 78 on the legs of the clip 72 to make a smooth surface for sliding on the resistance 70 and conductor 74. One terminal 80 of the transistor 58 is connected by a conductive area 82 to an external lead 84. Another terminal 86 of the transistor 58 is connected to the inner end of the conductive strip 74 by which such terminal lead is electrically connected to the resistance 70 (through clip 72) and to a third external lead 88. The third terminal 90 of the transistor 58 is grounded to the cover 59 and hence is connected to the lower electrode of capacitor 62 and resistance 70. The circuit thus established is shown in Fig. 8.

The following steps are performed in providing a mounting for an electrical component according to this invention:

(1) Mold a printed circuit plate out of material such as ceramic with a recess of sufficient size to contain the component or components to be mounted and with holes in the bottom for the terminals.

(2) Place the electrical component in the recess with the terminals extending through the holes.

(3) Metallize the area on the surface of the printed circuit plate around the area for the cover and around the terminal holes with a suitable metal such as silver.

(4) Solder the cover to seal the recess.

(5) Seal the terminal holes with solder to hermetically seal the entire unit.

This invention can be used many times on the same printed circuit plate in order to mount and seal the components individually or together in an electrical circuit. The invention has particular use for miniature circuits, especially for circuits requiring transistors. It is readily seen that the usual encapsulating resin coating or metal container of the transistor is eliminated by the use of the printed circuit recess; this is accomplished without adversely affecting the dependability or life expectancy of the transistor. Although only several specific embodiments of this invention have been shown and described, many modifications thereof are possible. This invention, therefore, is not to be restricted except in so far as is necessitated by the prior art and by the spirit of the appended claims.

We claim as our invention:

1. A mounting and electrically conductive seal for an electrical component connected with printed circuitry comprising, an insulating base of ceramic having an electrical impedance element bonded to a surface thereof, a recess in said base having an opening, terminal-receiving holes extending from said recess to a surface of said base, metalized areas on said base surrounding said opening and said holes, at least one of said areas surrounding said holes being electrically connected to said electrical impedance element, an electrical component within said recess, said component having terminals extending through said holes, cover means for said component, sealing means between said cover means and the metalized area surrounding said opening, and solder sealing means between said terminals and the metalized area surrounding said holes, whereby said component is sealed in said recess and an electrical connection established by said solder sealing means between one of said terminals and said impedance element.

2. A mounting and seal for an electrical component as claimed in claim 1 in which said cover means is a separate metal cover over said opening, said sealing means between said separate cover and the metalized area surrounding said opening is electrically conductive, and there is an electrical impedance element bonded to a surface of said base and electrically connected to said last mentioned metalized area.

3. A mounting and seal for an electrical component as claimed in claim 1 in which there is a metal liner in said recess around said component, said cover is electrically conductive, and said sealing means is solder providing an electrical connection between said cover means, the metalized area surrounding said opening, and said liner.

4. A mounting and seal for an electrical component as claimed in claim 3 in which the sealing means between said cover means and said liner is a fused seal made at a lower temperature than the sealing means between said liner and the metalized area surrounding said opening.

References Cited in the file of this patent

UNITED STATES PATENTS

| | | |
|---|---|---|
| 1,281,917 | Eby | Oct. 15, 1918 |
| 2,101,896 | Burlingame | Dec. 14, 1937 |
| 2,151,885 | Baier | Mar. 28, 1939 |
| 2,170,648 | Baier et al. | Aug. 22, 1939 |
| 2,173,906 | Katsch | Sept. 26, 1939 |
| 2,462,020 | Craig | Feb. 15, 1949 |
| 2,474,988 | Sargrave | July 5, 1949 |
| 2,506,866 | Gehrke | May 9, 1950 |
| 2,543,384 | Squier | Feb. 27, 1951 |
| 2,606,986 | Sweger | Aug. 12, 1952 |
| 2,641,672 | Parrish | June 9, 1953 |

FOREIGN PATENTS

| | | |
|---|---|---|
| 583,285 | Great Britain | Dec. 13, 1946 |
| 644,565 | Great Britain | Oct. 11, 1950 |
| 78,613 | Denmark | Dec. 6, 1954 |